(12) United States Patent
Satomi

(10) Patent No.: US 10,567,616 B2
(45) Date of Patent: Feb. 18, 2020

(54) IMAGE PROCESSING APPARATUS

(71) Applicant: KYOCERA Document Solutions Inc., Osaka (JP)

(72) Inventor: Seiki Satomi, Osaka (JP)

(73) Assignee: Kyocera Document Solutions, Inc. (JP)

( * ) Notice: Subject to any disclaimer, the term of this patent is extended or adjusted under 35 U.S.C. 154(b) by 0 days.

(21) Appl. No.: 16/248,099

(22) Filed: Jan. 15, 2019

(65) Prior Publication Data
US 2019/0230247 A1 Jul. 25, 2019

(30) Foreign Application Priority Data
Jan. 22, 2018 (JP) .................. 2018-008428

(51) Int. Cl.
*H04N 1/387* (2006.01)
*H04N 1/32* (2006.01)
*G11C 7/22* (2006.01)

(52) U.S. Cl.
CPC ............. *H04N 1/3877* (2013.01); *G11C 7/22* (2013.01); *H04N 1/32358* (2013.01)

(58) Field of Classification Search
CPC . G06T 7/223; G06T 1/20; G06T 2207/10016; G06T 2207/20016; G06T 2207/20021; G06T 7/207; G06T 7/238; G06T 7/246; G06F 12/0891; H04N 19/521; H04N 19/527; H04N 5/145; H04N 5/23254
USPC .................. 358/474, 498, 488, 448
See application file for complete search history.

(56) References Cited

U.S. PATENT DOCUMENTS

| | | | | |
|---|---|---|---|---|
| 5,848,114 A * | 12/1998 | Kawai | ............... | G06T 11/003 378/4 |
| 2006/0204883 A1* | 9/2006 | Nakayama | ........... | G03G 9/0804 430/111.4 |
| 2012/0162475 A1* | 6/2012 | Lin | ................. | H04N 5/145 348/231.99 |
| 2013/0003083 A1* | 1/2013 | Satomi | ................. | H04N 1/3935 358/1.2 |
| 2013/0176591 A1* | 7/2013 | Nakamura | ......... | H04N 1/00933 358/1.15 |
| 2013/0342875 A1* | 12/2013 | Satomi | ................. | H04N 1/3935 358/2.1 |

(Continued)

FOREIGN PATENT DOCUMENTS

| | | |
|---|---|---|
| JP | 2000-125112 | 4/2000 |
| JP | 2006-197050 | 7/2006 |

*Primary Examiner* — Negussie Worku

(57) ABSTRACT

An image processing apparatus includes a line memory, a block outputting unit, a data writing unit, a data reading unit, and a controller. To the line memory, a memory area is allocated, and the memory area has a width of a constant number of words in a static RAM (Random Access Memory). The block outputting unit is configured to output image data of an image block obtained by dividing a document image. The data writing unit is configured to write the image data of the image block into the line memory. The data reading unit is configured to read the image data from the line memory word by word, and output the image data in an order corresponding to a rotation angle. The controller is configured to set a block size of the image block as a value corresponding to the rotation angle.

4 Claims, 7 Drawing Sheets

(56) References Cited

U.S. PATENT DOCUMENTS

| | | | |
|---|---|---|---|
| 2014/0185938 A1* | 7/2014 | Tamayama | H04N 19/527 |
| | | | 19/527 |
| 2015/0237225 A1* | 8/2015 | Tanaka | H04N 1/00413 |
| | | | 358/1.9 |
| 2015/0379378 A1* | 12/2015 | Yokota | H04N 1/00917 |
| | | | 358/1.15 |
| 2017/0302812 A1* | 10/2017 | Satomi | H04N 1/00307 |
| 2019/0005622 A1* | 1/2019 | Niwa | G06T 7/223 |

* cited by examiner

FIG. 5
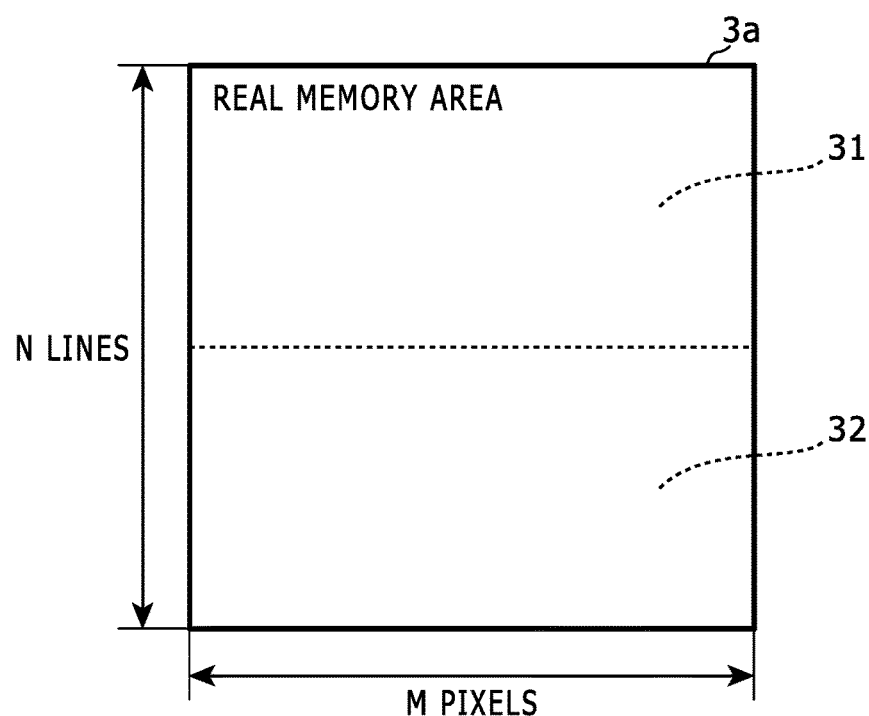
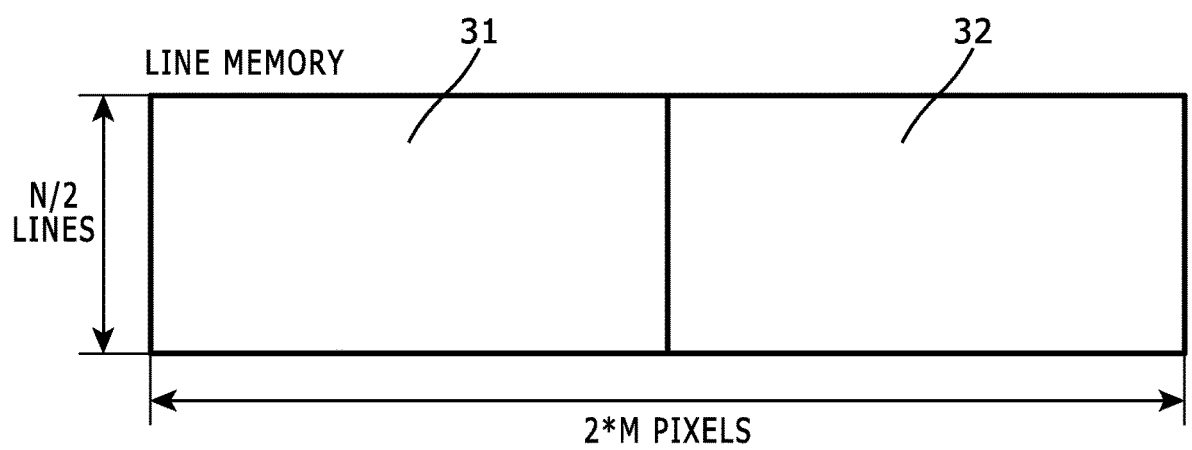

IMAGE PROCESSING APPARATUS

CROSS-REFERENCE TO RELATED APPLICATIONS

This application relates to and claims priority rights from Japanese Patent Application No. 2018-008428, filed on Jan. 22, 2018, the entire disclosures of which are hereby incorporated by reference herein.

BACKGROUND

1. Field of the Present Disclosure

The present disclosure relates to an image processing apparatus.

2. Description of the Related Art

An image processing apparatus secures a buffer of a minimum size required for a rotation process in accordance with a rotation angle of an image, and accesses image data in the buffer in accordance with an access manner corresponding to the rotation angle and thereby performs the rotation process.

Another image processing apparatus performs a rotation process for each image block by an angle of 90 degrees or a multiple of 90 degrees.

When the rotation process is performed as a software process such that the aforementioned image processing apparatus performs, the buffer suitable for the rotation angle can be secured. However, when the rotation process is performed as a hardware process for high speed, a line memory having a predetermined size is used and therefore a larger rotation angle requires a line memory of a larger size.

SUMMARY

An image processing apparatus according to an aspect of the present disclosure includes a line memory, a block outputting unit, a data writing unit, a data reading unit, and a controller. To the line memory, a memory area is allocated, and the memory area has a width of a constant number of words in a static RAM (Random Access Memory). The block outputting unit is configured to output image data of an image block obtained by dividing a document image. The data writing unit is configured to write the image data of the image block into the line memory. The data reading unit is configured to read the image data from the line memory word by word, and output the image data in an order corresponding to a rotation angle. The controller is configured to set a block size of the image block as a value corresponding to the rotation angle.

These and other objects, features and advantages of the present disclosure will become more apparent upon reading of the following detailed description along with the accompanied drawings.

BRIEF DESCRIPTION OF THE DRAWINGS

FIG. 5 shows a diagram that explains dividing the memory area 3a for a first mode;

DETAILED DESCRIPTION

Hereinafter, embodiments according to an aspect of the present disclosure will be explained with reference to drawings.

Embodiment 1

Figure 1:
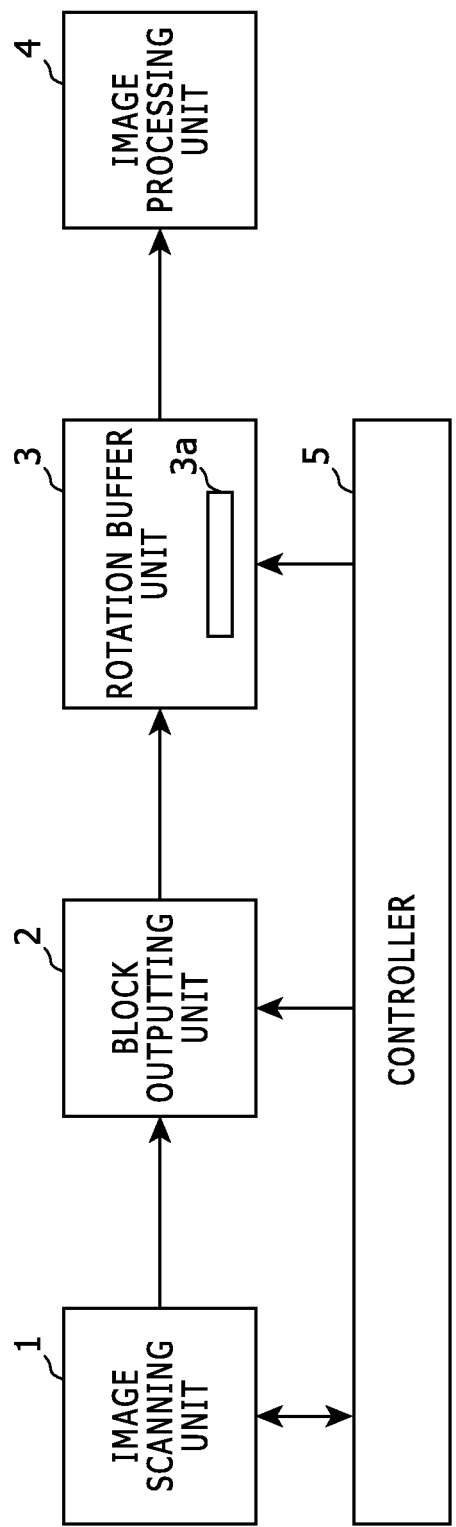
FIG. 1 shows a block diagram that indicates a configuration of an image processing apparatus according to an embodiment of the present disclosure.

FIG. 1 shows a block diagram that indicates a configuration of an image processing apparatus according to an embodiment of the present disclosure. The image processing apparatus shown in FIG. 1 is a scanner, a copier, a facsimile machine, a mullet function peripheral or the like for example, and optically scans a document image from a document and rotates the document image with a hardware process.

The image processing apparatus includes an image scanning unit 1, a block outputting unit 2, a rotation buffer unit 3, an image processing unit 4, and a controller 5.

The image scanning unit 1 includes a platen glass, an automatic document feeder, an image scanning optical system, an imaging sensor element, an image data generating circuit and the like, and takes a document image of a document put on the platen glass or a document transported by the automatic document feeder using the imaging sensor element through the image scanning optical system, and outputs image data of the image scanned by the imaging sensor (i.e. the document image). Here the imaging sensor element is a line sensor, and the image scanning unit 1 outputs the image data line by line.

The image scanning unit 1 is capable of performing a first mode and a second mode as an operation mode; in the first mode, the image scanning unit 1 scans a document image of a document transported by the automatic document feeder; and in the second mode, the image scanning unit 1 scans a document image of a document put on the platen glass.

For example, the automatic document feeder includes an sensor that detects that a document is put on the automatic document feeder; and if the sensor detects a document, the image scanning unit 1 performs the image scanning in the first mode, otherwise if not, the image scanning unit 1 performs the image scanning in the second mode.

The block outputting unit 2 is a buffer circuit that receives the image data outputted from the image scanning unit 1, and outputs to the rotation buffer unit 3 image data of an image block obtained by dividing a document image.

Upon receiving from the image scanning unit 1 lines (i.e. lines in the document image) of the same number of the line number (i.e. the width in the secondary scanning direction) of the image block, the block outputting unit 2 outputs in a predetermined order image data of image blocks obtained by dividing the lines in a primary scanning direction.

The rotation buffer unit 3 is a buffer that temporarily keeps the image block for a rotation process of the image block.

The rotation buffer unit 3 includes a memory area 3a that has a width of a constant number of words in a static RAM (not shown), and in the memory area 3a, the predetermined number N (N>1) of line memories 11-1 to 11-N are set.

Figure 2:
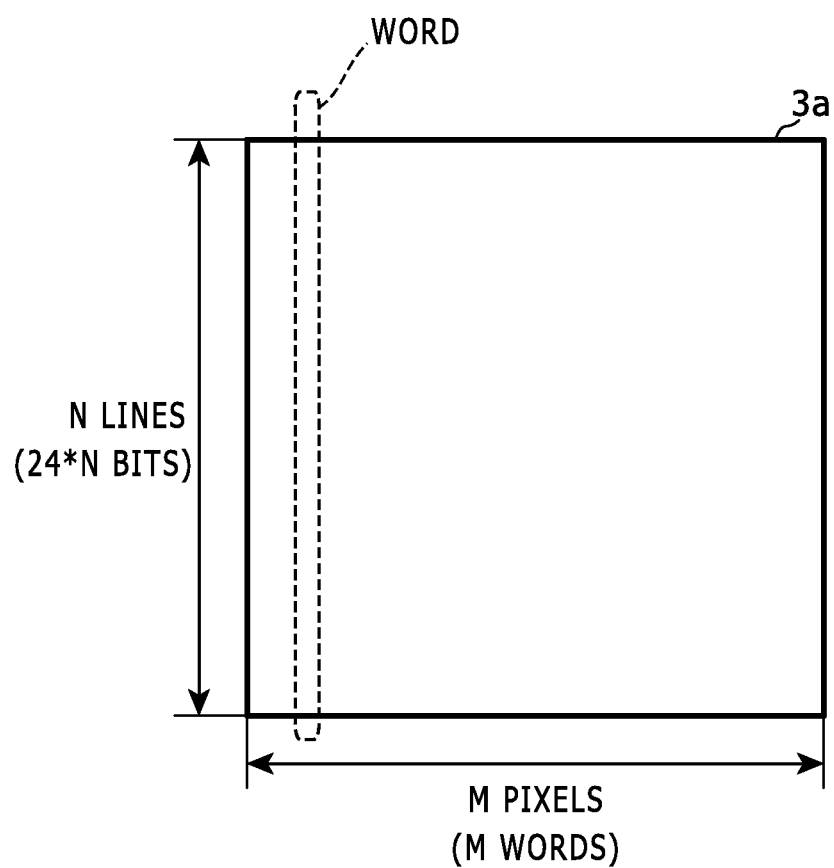
FIG. 2 shows a diagram that explains a memory area 3a shown in FIG. 1.

FIG. 2 shows a diagram that explains the memory area 3a shown in FIG. 1.

One word as a unit of reading or writing corresponds to N pixels in N lines at one position in the primary scanning direction, and therefore an area for M pixels by N lines is secured as the memory area 3a. Here, if a data amount of one pixel is 24 bits (for example, in case of 8 bit RGB color data), then the bit length of one word is 24*N bits.

Figure 3:
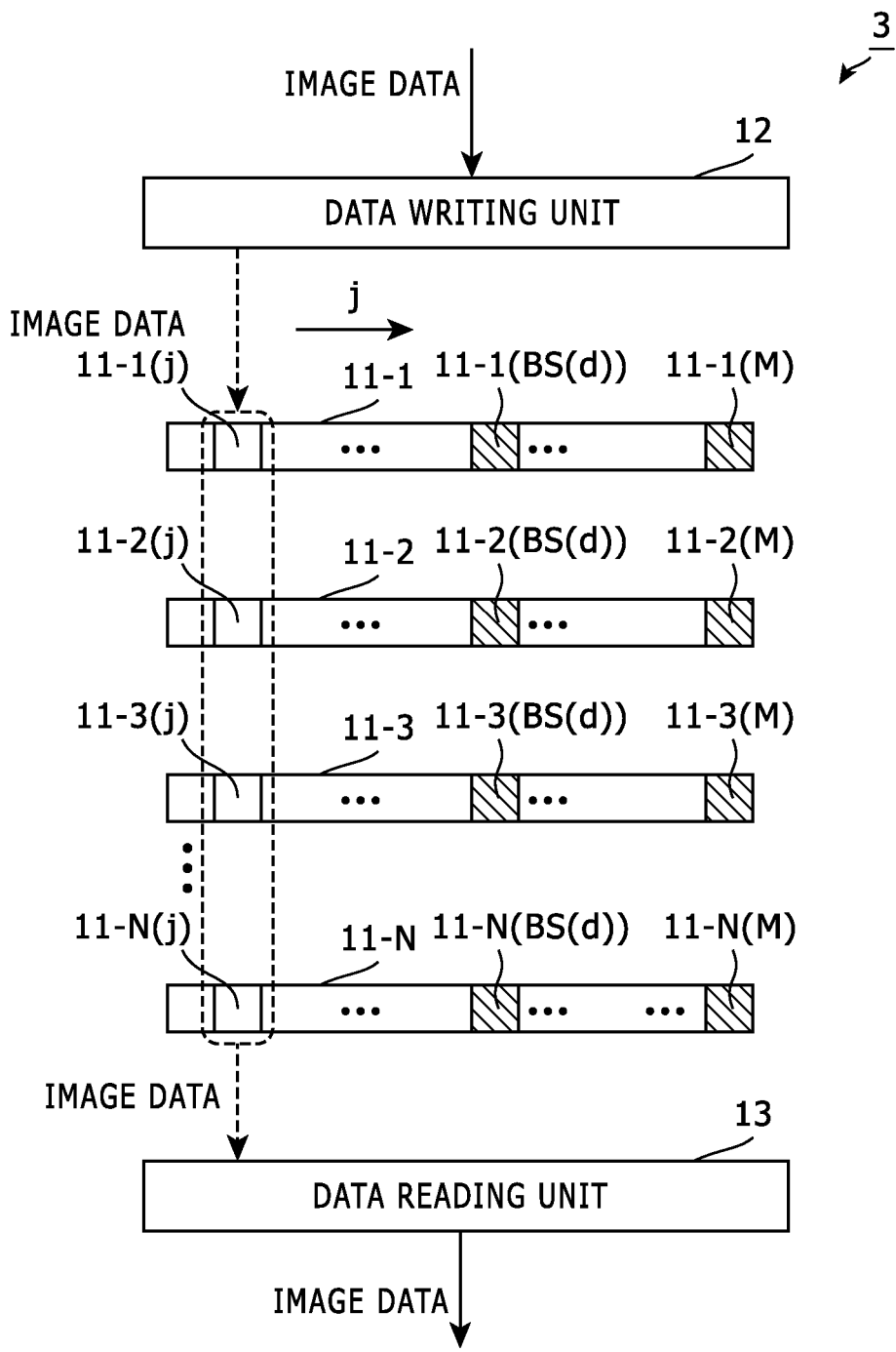
FIG. 3 shows a diagram that indicates a configuration of a rotation buffer unit 3 in Embodiment 1.

FIG. 3 shows a diagram that indicates a configuration of a rotation buffer unit 3 in Embodiment 1. As shown in FIG. 3, the rotation buffer unit 3 further includes a data writing unit 12 and a data reading unit 13.

The data writing unit 12 is a circuit that writes image data of the aforementioned image block into the line memories 11-1 to 11-N.

The data reading unit 13 reads the image data from the line memories 11-1 to 11-N word by word, and outputs the image data in an order corresponding to a rotation angle.

Specifically, as image data of the j th word (j=1, . . . , M), image data of the j th pixels in the line memories 11-1 to 11-N (i.e. image data of N pixels) is read at one time of data reading.

Returning to FIG. 1, the image processing unit 4 performs a predetermined image process for image data of the rotated document image.

The controller 5 controls the image scanning unit 1, the block outputting unit 2, the rotation buffer unit 3 and the like. In particular, the controller 5 sets a block size of the aforementioned image block as a value corresponding to the rotation angle.

Here the rotation angle may be set by a user. Alternatively, the rotation angle may be automatically set so as to cause a tilting angle of the document image to be zero. In such a case, the tilting angle is automatically detected in the scanned image.

Figure 4:
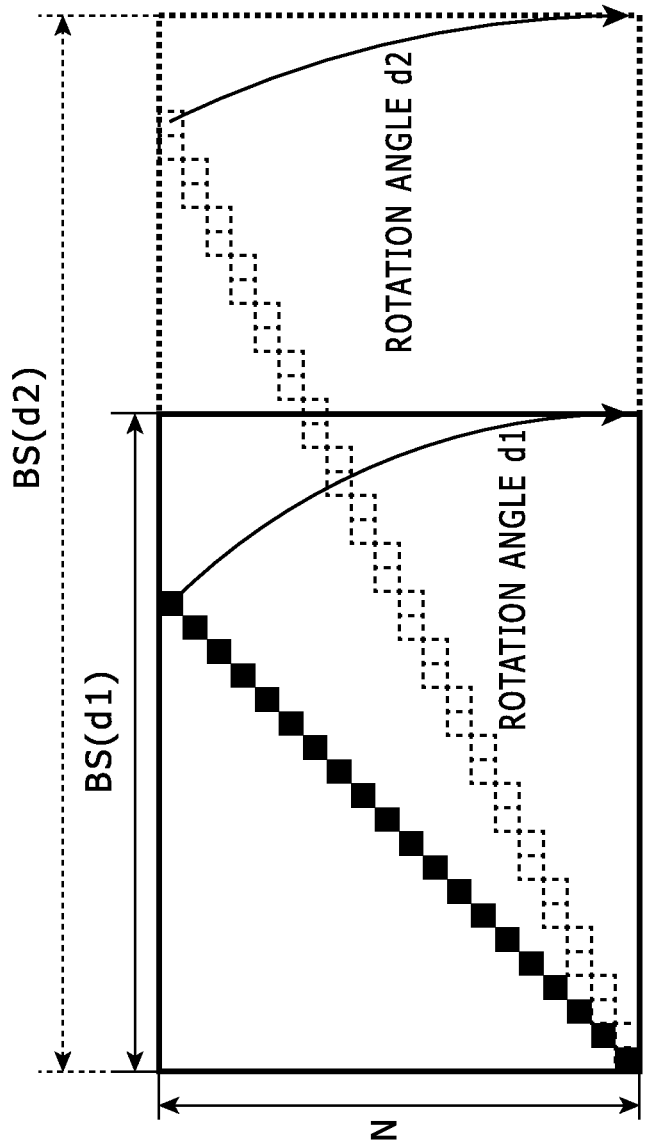
FIG. 4 shows a diagram that explains a block size set to a block outputting unit 2 shown in FIG. 1.

FIG. 4 shows a diagram that explains a block size set to a block outputting unit 2 shown in FIG. 1. The block size is the width (number of pixels) of the image block in the primary scanning direction. The secondary-scanning-directional width (number of pixels) of the image block may also be the block size.

When the number of the line memories 11-1 to 11-N is N and the rotation angle is d (degrees), the uppermost value BSm(d) of the block size BS(d) is expressed at N=ceil(BSm(d)*sin(d*pi/180))+1. Here, ceil(x) is a function that return a minimum integer number that is equal to or larger than x, and pi is the circumference ratio. It should be noted that "+1" in the right side of the expression means one line memory used when the rotation is not performed. For example, If N=20 and d=45 degrees, then the expression is (20−1)=ceil(BSm(45)*sin(45*pi/180)), and therefore we get BSm(45)=26 pixels. Alternatively, if N=20 and d=10 degrees, then the expression is (20−1) ceil(BSm(10)*sin(45*pi/180)), and therefore we get BSm(10)=109 pixels.

Further, the controller 5 (a) sets an uppermost value of the rotation angle in the first mode to be smaller than an uppermost value of the rotation angle in the second mode, (b) sets the block size in the first mode to be larger than the block size in the second mode, (c) divides the memory area in a word direction by a predetermined division number and thereby sets the number of line memories in the first mode to be smaller than the number of line memories in the second mode and sets the length of the line memories in the first mode to be larger than the length of the line memories in the second mode.

In the first mode, document images are continuously scanned using the auto document feeder, and a high speed processing is required for the rotation of the document images, and therefore, the block size is set to be larger than the block size in the second mode, and an order of the data reading and/or the data writing is changed from an order in the second mode.

Figure 6:
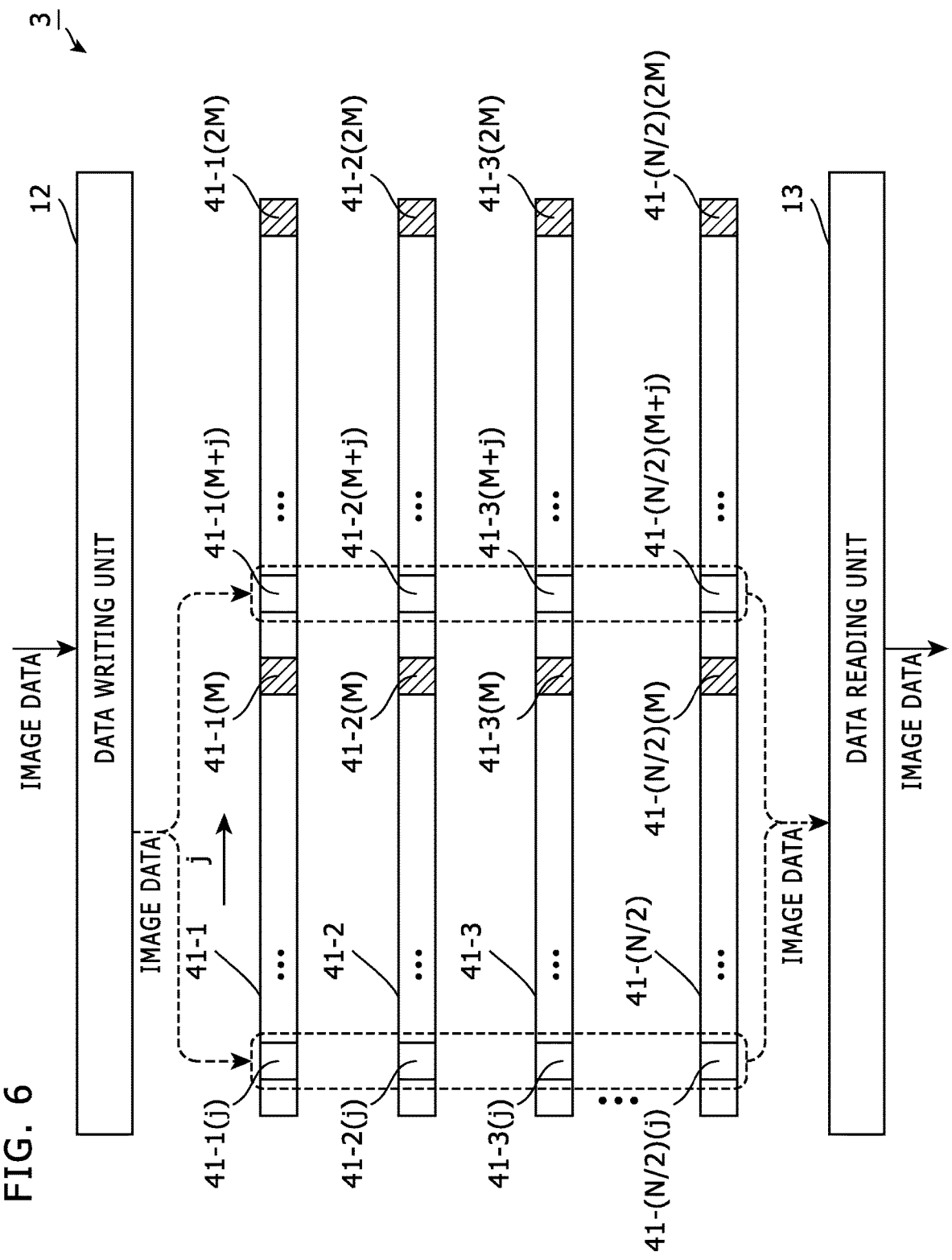
FIG. 6 shows a diagram that indicates a configuration of a rotation buffer unit 3 in the first mode in Embodiment 1.

FIG. 5 shows a diagram that explains dividing the memory area 3a for a first mode. FIG. 6 shows a diagram that indicates a configuration of a rotation buffer unit 3 in the first mode in Embodiment 1.

It should be noted that FIG. 3 indicates a configuration of the rotation buffer unit 3 in the second mode, and FIG. 4 indicates the block size BS(d) in the second mode.

In a case shown in FIG. 5, the memory area 3a is divided into two divisional areas 31 and 32, and as shown in FIG. 6, substantially (i.e. from a view of the data reading and the data writing), (N/2) line memories 41-1 to 41-(N/2) are set such that the number of pixels in each line memory 41-i (i=1, . . . , N/2) is 2*M.

Thus, although the memory area 3a is physically secured as shown in FIG. 2, the line memories 41-1 to 41-(N/2) are logically secured as shown in FIG. 6.

Therefore, N pixels are physically read or written by for reading or writing one word, and therefore as shown in FIG. 6, in the first mode, at one time of writing, image data of two pixel positions (j and M+j) is written, and at one time of reading, image data of two pixel positions (j and M+j) is read.

The number of words in the memory area 3a is set in accordance with the block size and the division number (i.e. number of the divisional areas) in the first mode. For example, if the block size BS1 is 256 and the division number is 2 in the first mode, then the memory area 3a is secured such that the number of words is 128 (=256/2).

Further, for example, an uppermost value of the rotation angle in the second mode is set as 45 degrees, and an uppermost value of the rotation angle in the first mode is set as 2 degrees.

For example, the block outputting unit 2, the rotation buffer unit 3, and the controller 5 are embodied as an ASIC (Application Specific Integrated Circuit) that performs the aforementioned processes using a specific-purpose circuit without a processor that performs a software process.

The following part explains a behavior of the aforementioned image processing apparatus.

Here, the behavior is explained in a case that the aforementioned division number is 2, but the division number may be 3 or more.

The controller 5 determines the operation mode of the image scanning unit 1 (the aforementioned first mode or second mode), and sets the block outputting unit 2 and the rotation buffer unit 3 so as to act in accordance with the determined operation mode. Further the controller 5 determines a rotation angle of the document image and sets the rotation angle to the rotation buffer unit 3.

(a) The First Mode

When the image scanning unit 1 performs the image scanning in the first mode, the controller 5 sets a predetermined block size for the first mode to the block outputting unit 2, and sets a configuration of line memories in the rotation buffer unit 3 as shown in FIG. 6.

Subsequently, the block outputting unit 2 outputs image data of two pixels at pixel positions j and M+j (j=1, . . . , BS1/2; BS1=2*M) in turn in each line of the image block; and in the rotation buffer unit 3, as shown in FIG. 6, the data writing unit 12 writes the image data of the two pixels into corresponding positions in the line memories 41-1 to 41-(N/2) by writing of one word (i.e. one time of writing).

In the aforementioned manner, image data of the image block is stored into the line memories 41-1 to 41-(N/2) in turn; and when image data of lines of which the number is required for the aforementioned rotation angle is stored in the line memories 41-1 to 41-(N/2), the data reading unit 13 reads the image data in turn, performs a rotation process according to the rotation angle, and outputs image data of one rotated line. Subsequently, the data reading unit 13 performs the same rotation process for each line in turn, and outputs image data of one rotated line.

In this process, as shown in FIG. 6, the data reading unit 13 reads as one word image data of total N pixels at pixel positions j and M+j (j=1, . . . , M) in each line memories 41-1 to 41-(N/2) and performs the rotation process. Thus, even though the length of the line memory 41-i is 2*M, all data in the line memory 41-i is read by M times of reading.

As mentioned, in the first mode, the rotation buffer unit 3 divides the memory area 3a having a physically fixed size and thereby sets a long line memory 41-i and sets a large block size, and performs the rotation process at high speed.

(b) The Second Mode

When the image scanning unit 1 performs the image scanning in the second mode, the controller 5 sets a block size for the determined rotation angle to the block outputting unit 2, and sets a configuration of line memories in the rotation buffer unit 3 as shown in FIG. 3.

Subsequently, the block outputting unit 2 outputs image data of one pixel at a pixel position j (j=1, . . . , M) in turn in each line of the image block; and in the rotation buffer unit 3, as shown in FIG. 3, the data writing unit 12 writes the image data of the one pixel into a corresponding position in the line memories 11-1 to 11-N by writing of one word (i.e. one time of writing). Here, in an area for M pixels in the line memory 11-1, only an area of the block size BS(d) is used.

In the aforementioned manner, image data of the image block is stored into the line memories 11-1 to 11-N in turn; and when image data of lines of which the number is required for the aforementioned rotation angle is stored in the line memories 11-1 to 11-N, the data reading unit 13 reads the image data in turn, performs a rotation process according to the rotation angle, and outputs image data of one rotated line. Subsequently, the data reading unit 13 performs the same rotation process for each line in turn, and outputs image data of one rotated line.

In this process, as shown in FIG. 3, the data reading unit 13 reads as one word image data of total N pixels at pixel position j (j=1, . . . , M) in each line memories 11-1 to 11-N and performs the rotation process.

As mentioned, in the second mode, the rotation buffer unit 3 sets a large number of line memories 11-1 to 11-N in the memory area 3a having a physically fixed size, and thereby allows a large rotation angle and performs the rotation process with such lager rotation angle.

As mentioned, in Embodiment 1, the block outputting unit 2 outputs image data of an image block obtained by dividing a document image. The line memories 11-1 to 11-N is allocated in the memory area 3a, and the memory area 3a has a width of a constant number of words in a static RAM. The data writing unit 12 writes image data of the image block into the line memories 11-1 to 11-N. The data reading unit 13 reads the image data from the line memories 11-1 to 11-N word by word, and outputs the image data in an order corresponding to a rotation angle. The controller 5 sets a block size of the image block as a value corresponding to the rotation angle.

Consequently, (in the aforementioned second mode) the larger the rotation angle is, the smaller the block size is; and thereby, the rotation process is enabled as a hardware process using small scale line memories 11-1 to 11-N. In addition, (in the aforementioned second mode) the smaller the rotation angle is, the larger the block size is, and therefore, the higher the processing speed is.

Embodiment 2

Figure 7:
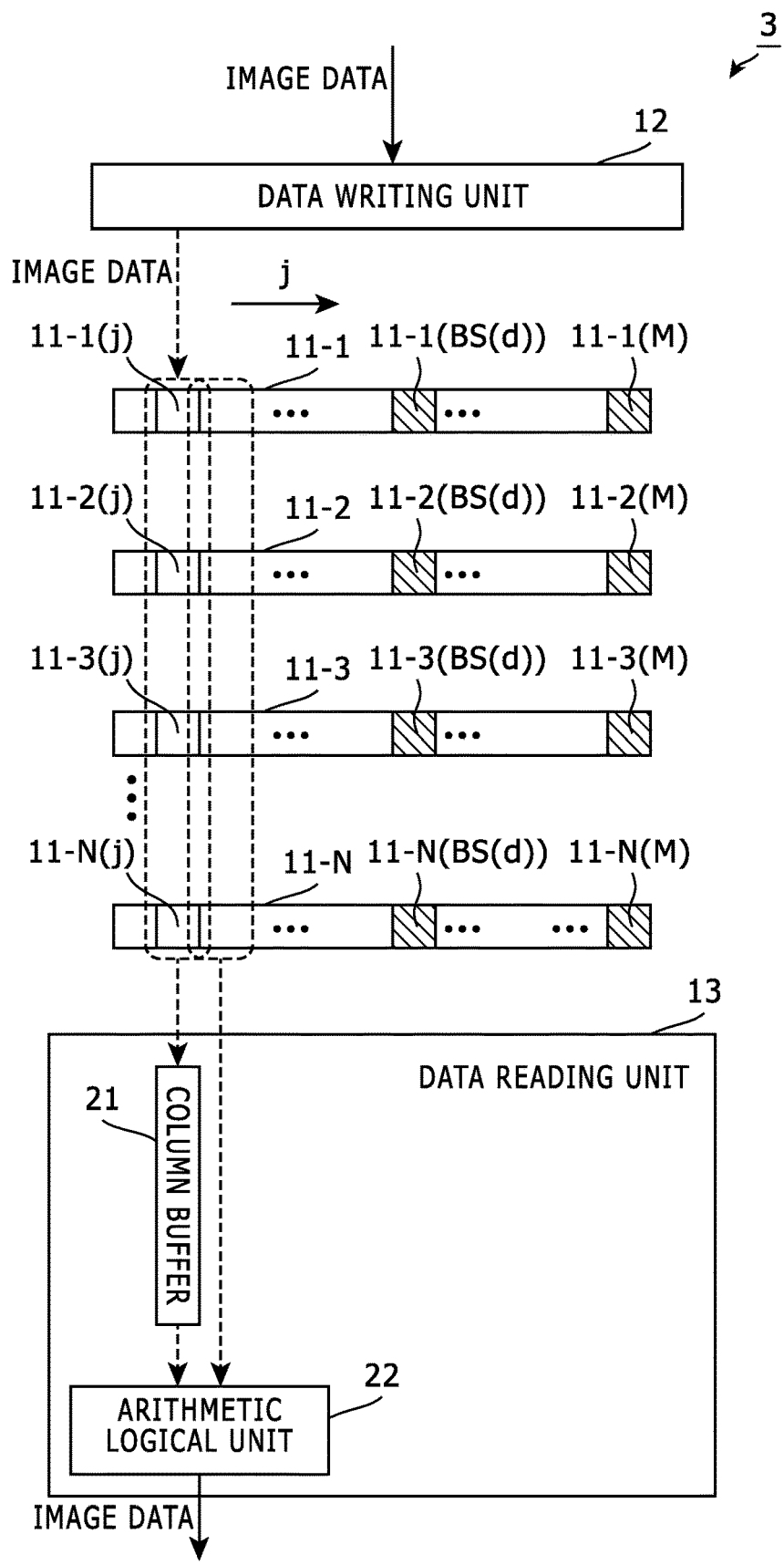
FIG. 7 shows a diagram that indicates a configuration of a rotation buffer unit 3 in Embodiment 2.

FIG. 7 shows a diagram that indicates a configuration of a rotation buffer unit 3 in Embodiment 2. In Embodiment 2, the rotation buffer unit 3 includes one or more column buffers 21 and an arithmetic logical unit 22. Further, in Embodiment 2, the data reading unit 13 memorizes in the column buffer(s) 21 the image data read word by word, and performs an interpolating process or a zooming process using the arithmetic logical unit 22 together with the rotation process on the basis of (a) the read image data and (b) the image data memorized in the column buffer(s) 21 (i.e. the image data read by previous reading).

Here the arithmetic logical unit 22 performs the aforementioned interpolating process or zooming process as a hardware process.

Other parts of the configuration and behaviors of the image processing apparatus in Embodiment 2 are identical or similar to those in Embodiment 1, and therefore not explained here.

As mentioned, in Embodiment 2, an interpolating process or a zooming process is performed as a hardware process together with the rotation process, and therefore, even if an interpolating process or a zooming process is requested, an additional processing time is not required for the interpolating process or the zooming process is It should be understood that various changes and modifications to the embodiments described herein will be apparent to those skilled in the art. Such changes and modifications may be made without departing from the spirit and scope of the present subject matter and without diminishing its intended advantages. It is therefore intended that such changes and modifications be covered by the appended claims.

What is claimed is:

1. An image processing apparatus, comprising:
a line memory to which a memory area is allocated, the memory area having a width of a constant number of words in a static RAM;
a block outputting unit configured to output image data of an image block obtained by dividing a document image;
a data writing unit configured to write the image data of the image block into the line memory;
a data reading unit configured to read the image data from the line memory word by word, and output the image data in an order corresponding to a rotation angle;
a controller configured to set a block size of the image block as a value corresponding to the rotation angle;
an automatic document feeder;
a platen glass; and
an image scanning unit capable of performing a first mode and a second mode, the first mode in which the image scanning unit scans the document image from a document transported by the automatic document feeder, the second mode in which the image scanning unit scans the document image from a document put on the platen glass;

wherein the controller (a) sets an uppermost value of the rotation angle in the first mode to be smaller than an uppermost value of the rotation angle in the second mode, (b) sets the block size in the first mode to be larger than the block size in the second mode, (c) divides the memory area in a word direction by a predetermined division number and thereby sets the number of line memories in the first mode to be smaller than the number of line memories in the second mode and sets the length of the line memories in the first mode to be larger than the length of the line memories in the second mode.

2. The image processing apparatus according to claim 1, wherein the constant number of the words is set in accordance with the block size and the division number in the first mode.

3. The image processing apparatus according to claim 1, wherein the uppermost value of the rotation angle in the second mode is 45 degrees.

4. The image processing apparatus according to claim 1, further comprising at least one column buffer;

wherein the data reading unit memorizes in the column buffer the image data read word by word, and performs an interpolating process or a zooming process together with a rotation process on the basis of the read image data and the image data memorized in the column buffer.

* * * * *